(12) United States Patent
Rusconi Clerici Beltrami et al.

(10) Patent No.: US 11,375,317 B2
(45) Date of Patent: Jun. 28, 2022

(54) MANUFACTURING METHOD FOR MULTIPLE MEMS SOUND TRANSDUCERS

(71) Applicant: USOUND GMBH, Graz (AT)

(72) Inventors: Andrea Rusconi Clerici Beltrami, Vienna (AT); Ferruccio Bottoni, Graz (AT); Nick Renaud-Bezot, Vienna (AT)

(73) Assignee: USound GmbH, Graz (AT)

( * ) Notice: Subject to any disclaimer, the term of this patent is extended or adjusted under 35 U.S.C. 154(b) by 227 days.

(21) Appl. No.: 16/745,959

(22) Filed: Jan. 17, 2020

(65) Prior Publication Data
US 2020/0236467 A1 Jul. 23, 2020

(30) Foreign Application Priority Data

Jan. 17, 2019 (DE) ..................... 10 2019 101 227.9
Jan. 18, 2019 (DE) ..................... 10 2019 101 325.9

(51) Int. Cl.
*H04R 17/00* (2006.01)
*B81C 1/00* (2006.01)
(Continued)

(52) U.S. Cl.
CPC ....... *H04R 17/005* (2013.01); *B81C 1/00182* (2013.01); *B81C 1/00865* (2013.01);
(Continued)

(58) Field of Classification Search
CPC ............................................ H01L 2924/16235
See application file for complete search history.

(56) References Cited

U.S. PATENT DOCUMENTS

| 7,348,263 B2 * | 3/2008 | Hashimoto ........... H03H 9/1071 |
| | | 257/E21.538 |
| 8,017,435 B2 * | 9/2011 | Leib ..................... B81C 1/0023 |
| | | 257/692 |

(Continued)

FOREIGN PATENT DOCUMENTS

| DE | 102014216223 | 3/2015 |
| DE | 102015107560 | 11/2016 |

(Continued)

OTHER PUBLICATIONS

German Search Report and English Translation thereof, DE Application No. 10 2019 101 325.9, dated Oct. 21, 2019, 14 pages.

(Continued)

*Primary Examiner* — Angelica M McKinney
(74) *Attorney, Agent, or Firm* — Dority & Manning, P.A.

(57) ABSTRACT

A manufacturing method for multiple MEMS sound transducers includes manufacturing a reconstructed wafer, separating multiple chips from the wafer, and encapsulating the chips in a molding material. A piezoelectric element of the particular chips is exposed to become deflectable along a stroke axis. The reconstructed wafer is connected to multiple diaphragms associated with the particular chips, wherein the diaphragms are each connected to the associated piezoelectric element so that the diaphragms are each deflectable together with the at least one associated piezoelectric element along the stroke axis. MEMS sound transducers, each of which including at least one of the chips and one of the diaphragms, are isolated. A MEMS sound transducer, which has been manufactured using the aforementioned manufacturing method, is also disclosed.

20 Claims, 6 Drawing Sheets

(51) Int. Cl.
*H04R 19/00* (2006.01)
*H04R 31/00* (2006.01)

(52) U.S. Cl.
CPC .......... *H04R 19/005* (2013.01); *H04R 31/00* (2013.01); *H04R 2201/003* (2013.01)

(56) References Cited

U.S. PATENT DOCUMENTS

| | | | |
|---|---|---|---|
| 9,584,886 | B2 | 2/2017 | Lee |
| 9,584,889 | B2 | 2/2017 | Escher-Poeppel et al. |
| 10,206,046 | B2 * | 2/2019 | Bottoni ................. B81B 7/0061 |
| 10,412,505 | B2 | 9/2019 | Rusconi Beltrami et al. |
| 10,433,063 | B2 | 10/2019 | Rusconi Clerici Beltrami et al. |
| 10,720,417 | B2 * | 7/2020 | Scanlan .................. H01L 24/96 |
| 10,840,200 | B2 * | 11/2020 | Fang ........................ H01L 21/56 |
| 11,049,734 | B2 * | 6/2021 | Chew ....................... H01L 21/78 |
| 11,114,315 | B2 * | 9/2021 | Chew .................... H01L 21/568 |
| 2017/0133334 | A1 * | 5/2017 | Kim ......................... H01L 24/20 |
| 2017/0164117 | A1 * | 6/2017 | Zou ......................... H04R 19/04 |
| 2017/0260043 | A1 | 9/2017 | Lin et al. |
| 2017/0288123 | A1 * | 10/2017 | Hatano .............. H03H 9/14538 |
| 2018/0327258 | A1 | 11/2018 | Steiert et al. |
| 2019/0112180 | A1 | 4/2019 | Yap et al. |

FOREIGN PATENT DOCUMENTS

| | | |
|---|---|---|
| DE | 102015116640 | 4/2017 |
| DE | 102017207887 | 10/2018 |
| WO | WO2016/180841 | 11/2016 |
| WO | WO-2017055012 A1 * | 4/2017 ............. H04R 17/00 |

OTHER PUBLICATIONS

Extended European Search Report of Application 20152246.3, dated Jun. 15, 2020, 6 pages.

* cited by examiner

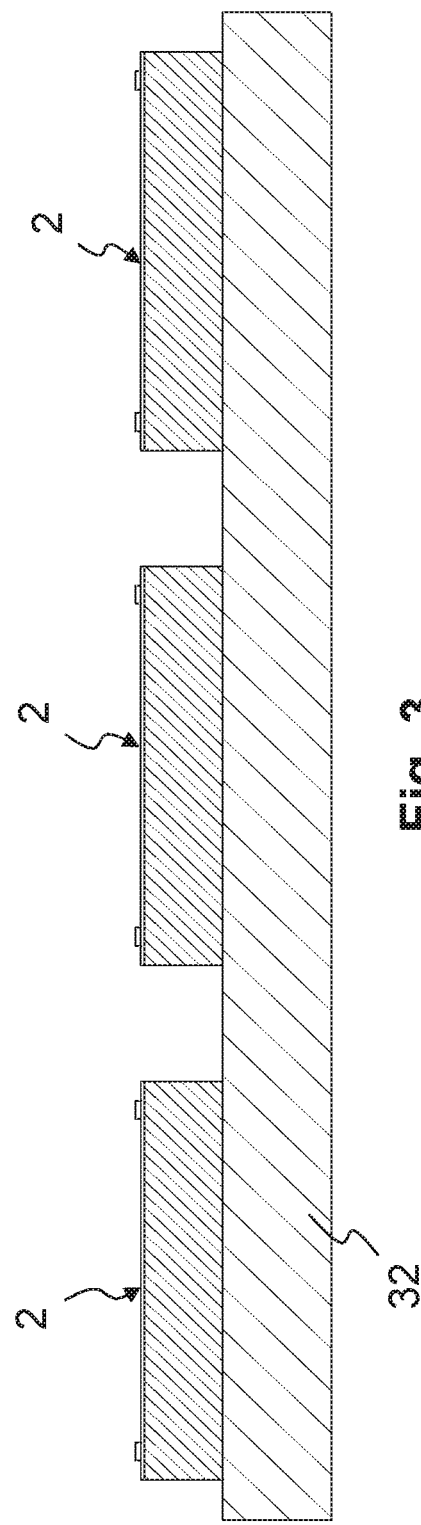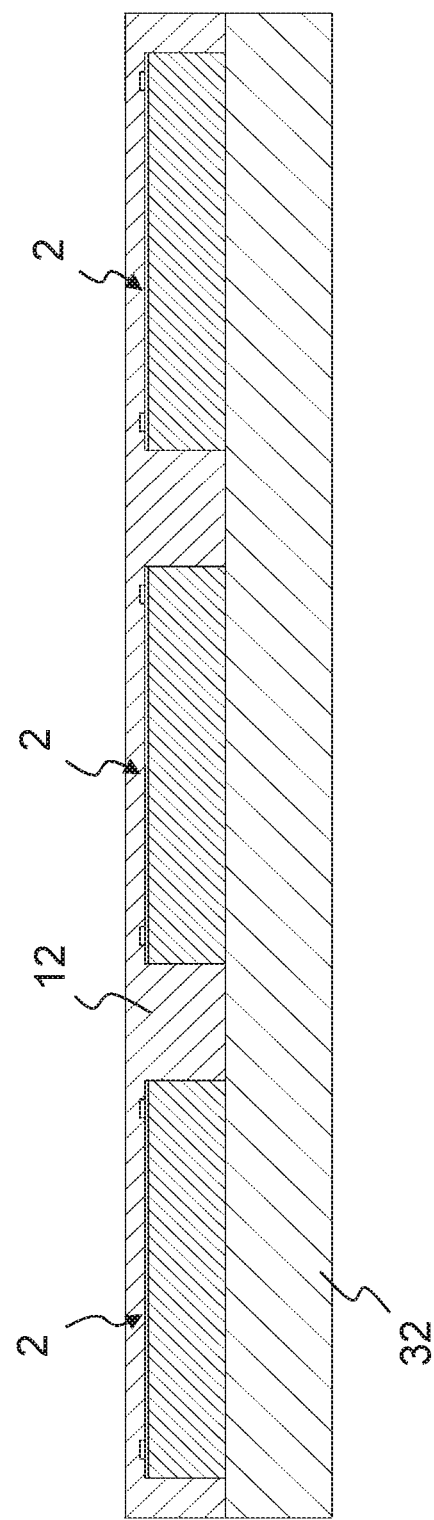

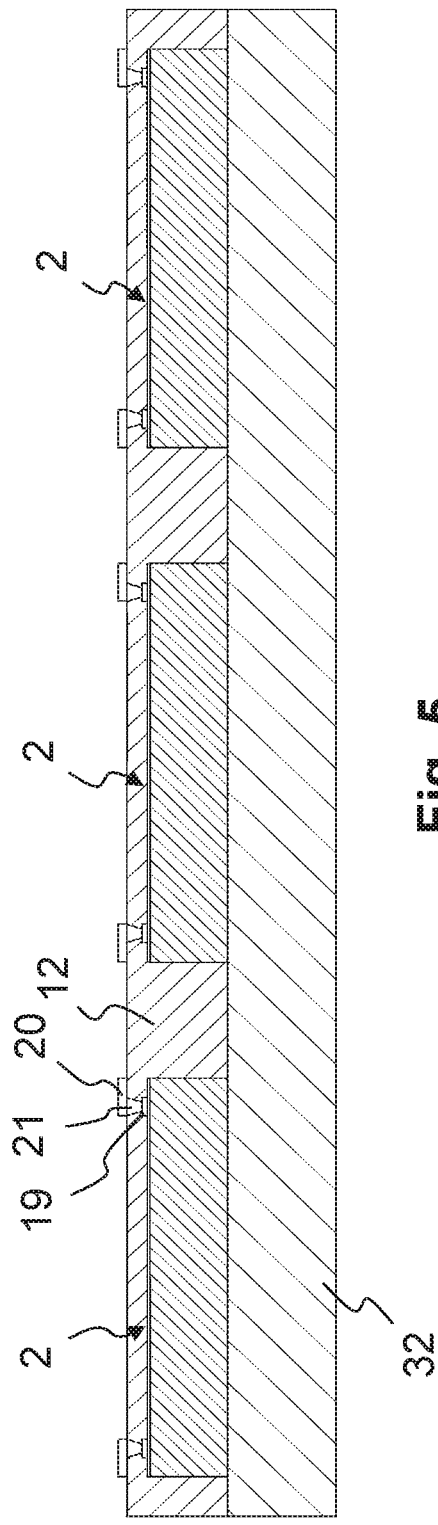
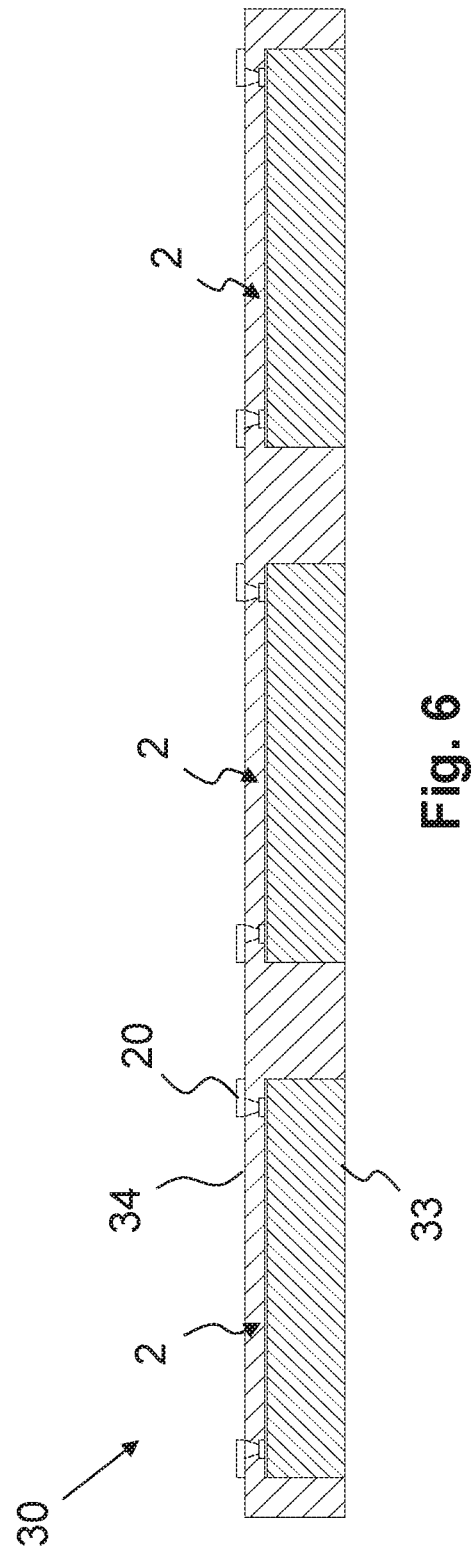

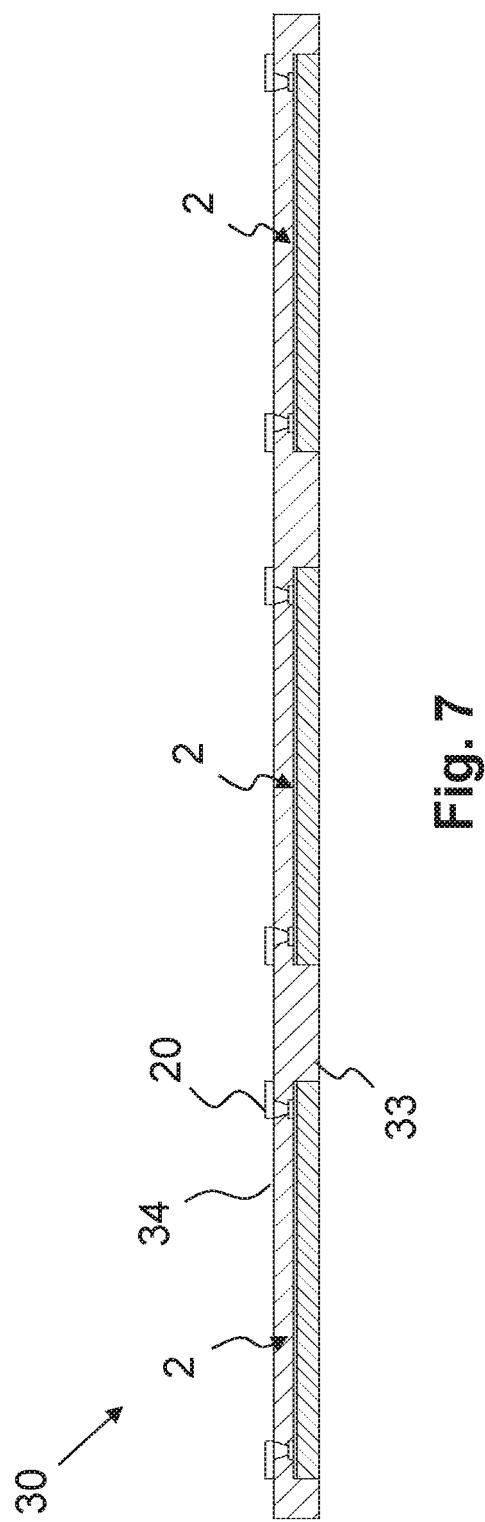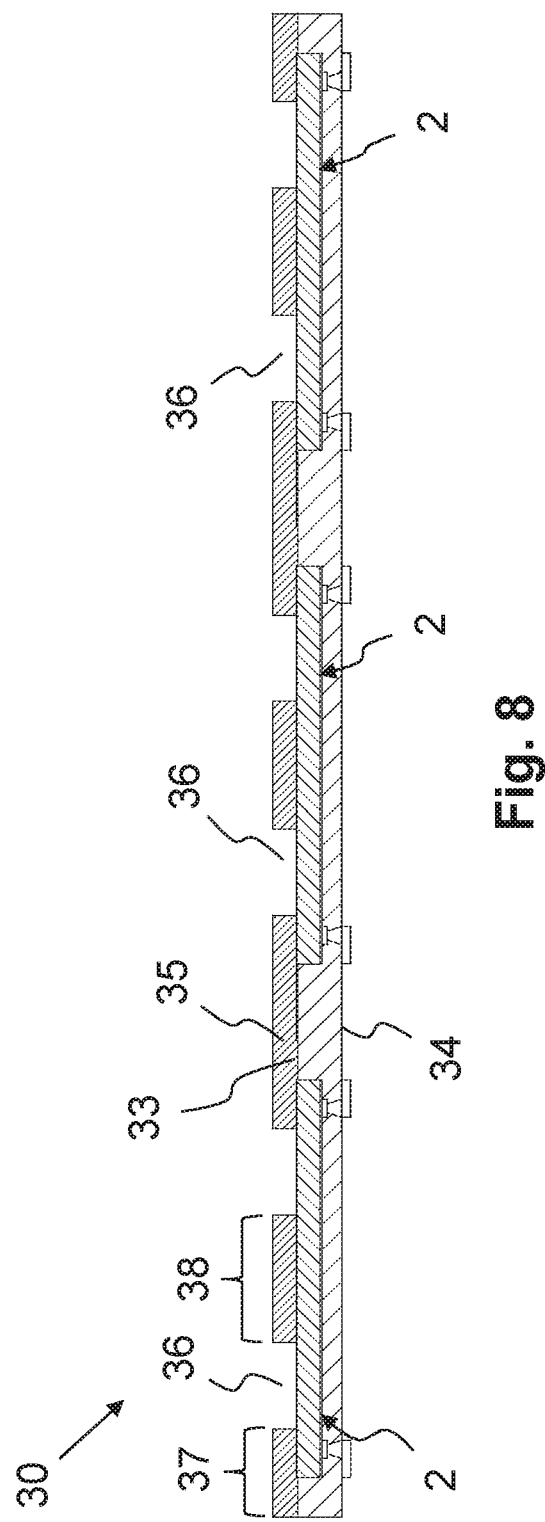

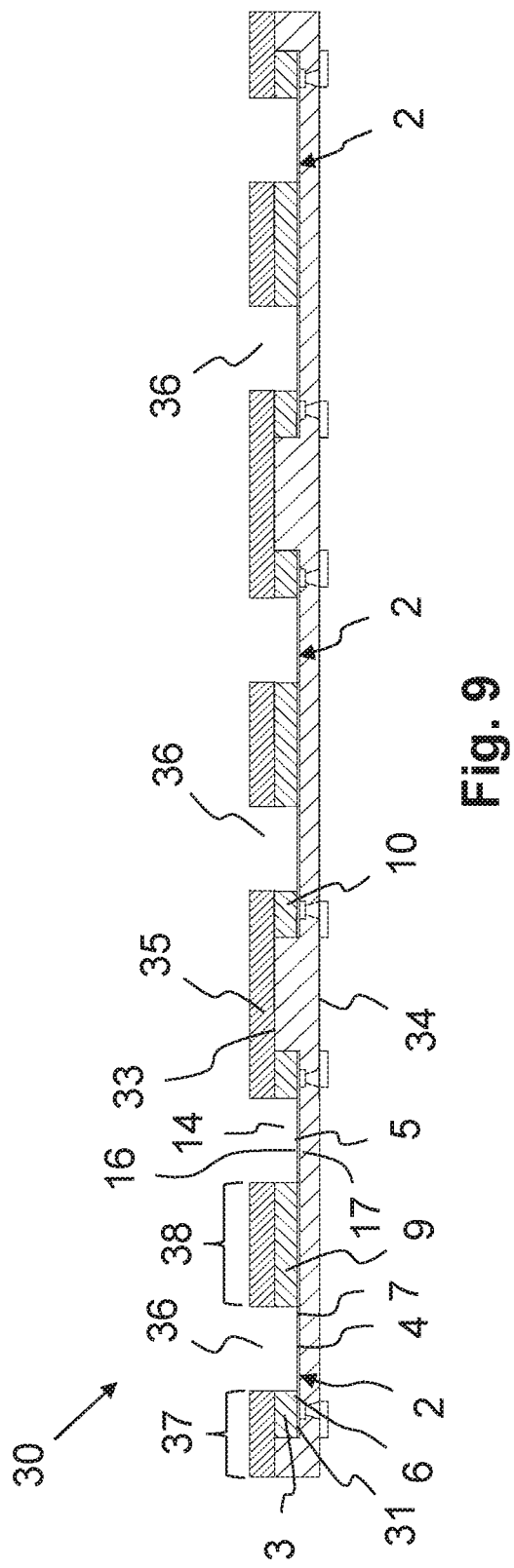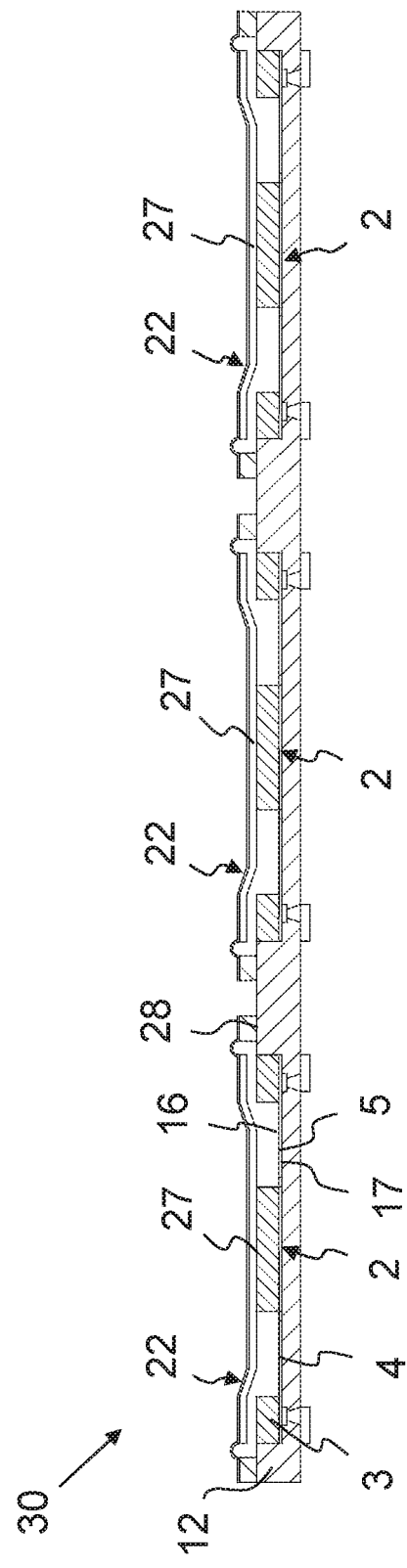

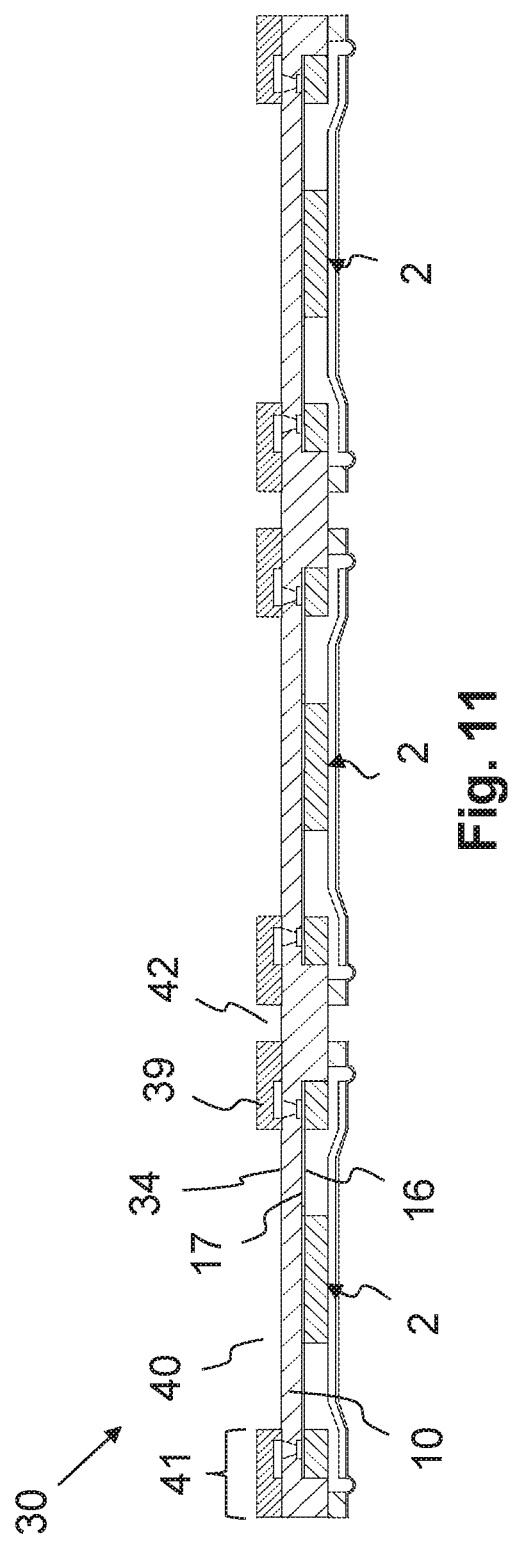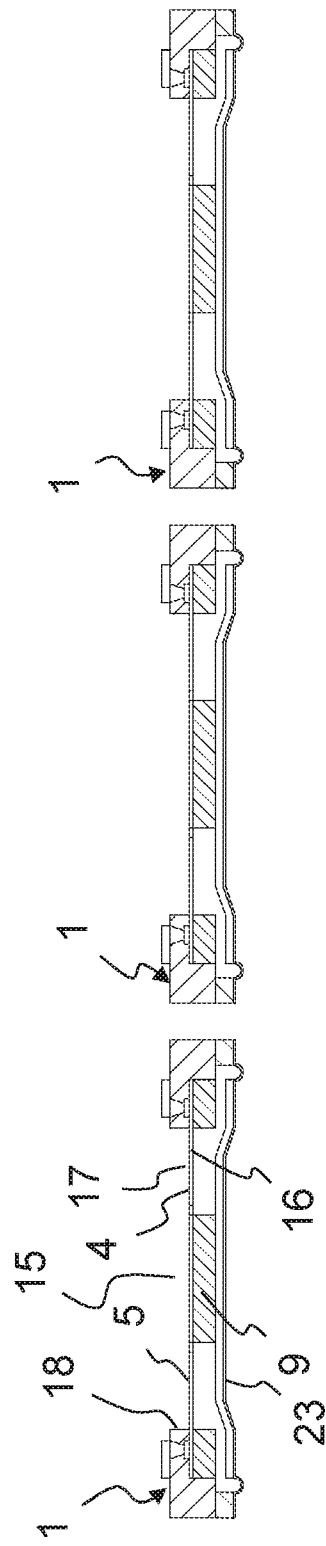

MANUFACTURING METHOD FOR MULTIPLE MEMS SOUND TRANSDUCERS

FIELD OF THE INVENTION

The present invention relates to a manufacturing method for multiple MEMS sound transducers, in particular for generating and/or detecting sound waves in the audible wavelength spectrum and/or ultrasonic range, and to a MEMS sound transducer manufactured using this method.

BACKGROUND OF THE INVENTION

U.S. Pat. No. 10,206,046, which is hereby incorporated herein by this reference for all purposes, describes a method for manufacturing a sound transducer arrangement, in which a diaphragm module is connected to a circuit board module, wherein a diaphragm of the diaphragm module and an actuator structure of the circuit board module, both of which are deflectable along a common z-axis, are positioned between a press punch and a reference tool and are pressed between these two, so that the two modules connect to each other in a first connection region. During the manufacture of the circuit board module, the actuator structure is fastened to a circuit board in the region of a first opening of a recess. Before the two modules are pressed together, the reference tool is inserted into the recess via a second opening, which is positioned opposite the first opening, and is positioned within the recess in such a way that the actuator structure and the diaphragm are held in position, during pressing, with the aid of the reference tool.

Furthermore, U.S. Pat. No. 9,584,886, which is hereby incorporated herein by this reference for all purposes, describes a method for manufacturing a sound transducer component. In this manufacturing method, a diaphragm of a precursor MEMS chip is initially exposed via etching from an underside and, thereafter, from a top side, so that the diaphragm can move along a stroke axis.

OBJECTS AND SUMMARY OF THE INVENTION

Among the objects of the present invention is therefore to provide a manufacturing method for MEMS sound transducers, with the aid of which MEMS sound transducers can be cost-effectively manufactured and/or the production waste can be reduced.

These objects are achieved by means of a manufacturing method for multiple MEMS sound transducers and by means of a MEMS sound transducer manufactured with the aid of this manufacturing method, having the features described below.

The invention relates to a manufacturing method for multiple MEMS sound transducers. The MEMS sound transducers are designed, in particular, for generating and/or detecting sound waves in the audible wavelength spectrum and/or ultrasonic range. Consequently, the MEMS sound transducers are, in particular, MEMS microphones and/or MEMS loudspeakers. In the manufacturing method, a reconstructed wafer is initially manufactured. The term "wafer" refers to plate-like elements, which are manufactured from monocrystalline or polycrystalline blanks. These are utilized as substrate for electronic components, such as chips. A wafer can have a circular or square shape. In the case of a square shape, a wafer is also referred to as a panel. In order to manufacture the reconstructed wafer, multiple chips of a wafer are separated from one another and arranged spaced apart from one another, in particular on a carrier. Thereafter, a molding material is cast around these chips, which are arranged spaced apart from one another. The molding material is, in particular, a plastic.

Moreover, with respect to the chips of the reconstructed wafer, at least one piezoelectric element is exposed in each case, so that this piezoelectric element, in particular a free end of the piezoelectric element, is deflectable along a stroke axis. The piezoelectric element is preferably a cantilever arm comprising at least one piezoelectric layer, whose one end is immovably fastened and whose other end can be deflected.

The exposure of the at least one piezoelectric element takes place only after the molding material has been cast around the chips, which are spaced apart from one another. As a result, the risk of damage of the at least one piezoelectric element is reduced, in particular when the reconstructed wafer is shipped or transported as a semi-finished product and is processed during the subsequent method steps. It is advantageous when the exposure of the at least one piezoelectric element takes place only after the molding material has cured. The at least one piezoelectric element, before exposure, is covered at least on one of its two sides by a material that prevents a deflection of the piezoelectric element. The term "exposure" is understood to mean uncovering the piezoelectric element on its top side and/or underside and/or shaping the side contour of the piezoelectric element in such a way that this piezoelectric element, in particular its free and/or movable end, can be deflected along the stroke axis.

The piezoelectric element is, in particular, a piezoelectric actuator, with the aid of which a diaphragm can be deflected in order to generate sound waves. Additionally or alternatively, the piezoelectric element is, in particular, a piezoelectric sensor, with the aid of which a deflection of the diaphragm can be detected in order to detect sound waves.

In addition, in the provided manufacturing method, the reconstructed wafer is connected to multiple diaphragms assigned to the particular chips. In this case, the diaphragms are each connected, in particular directly or indirectly via at least one further element arranged therebetween, to the at least one associated piezoelectric element in such a way that, after the piezoelectric elements have been exposed, the diaphragms are each deflectable together with the at least one associated piezoelectric element along the stroke axis. In the exposed state, the particular at least one piezoelectric element can therefore be moved together with the associated diaphragm along the stroke axis.

It is advantageous when multiple, in particular all, diaphragms provided for the particular chips are designed to be contiguous and/or in the form of a common diaphragm element, which is connected to the reconstructed wafer on the side of the reconstructed wafer provided therefor. As a result, multiple diaphragms can be installed in a single method step, whereby the manufacturing costs can be reduced. The diaphragm element is then divided into the individual diaphragms at a later time.

Alternatively, the diaphragms can be separated from one another and/or individually connected to the particular associated chips before they are mounted on the reconstructed wafer. Accordingly, it is advantageous, in particular, when the reconstructed wafer is connected to multiple diaphragm units associated with the particular chips. A diaphragm unit can encompass a diaphragm carrier and at least one diaphragm held in its edge region by the diaphragm carrier. With respect to connecting, a diaphragm of the particular diaphragm unit is connected to the at least one associated piezoelectric element. This can take place directly or indirectly via a coupling element arranged therebetween. In the exposed state, the piezoelectric element can therefore be moved together with the diaphragm along the stroke axis.

In particular at the end of the manufacturing method, the MEMS sound transducers, which then each comprise a chip and a diaphragm, in particular as part of a diaphragm unit, are isolated.

Multiple MEMS sound transducers can be highly cost-effectively manufactured using the aforementioned manufacturing method. This can be attributed, for example, to the fact that, due to the molding material of the reconstructed wafer, material of the particular chip (in particular of its substrate)—which is more expensive than the molding material—can be saved. Moreover, the manufacturing method is simplified due to the separate step of connecting the reconstructed wafer to multiple diaphragms, in particular diaphragm units, associated with the particular chips. Additionally or alternatively, as a result, the waste generated during the manufacture of the MEMS sound transducers is reduced, since the particular at least one piezoelectric element is exposed only after having been encapsulated in the molding material.

It is advantageous when the at least one piezoelectric element of the particular chips is exposed only after the encapsulation in the molding material but before the connection, in particular adhesion, to the associated diaphragm. As a result, damage of the at least one piezoelectric element can be prevented during the transport of the reconstructed wafer. Alternatively, it is advantageous when the at least one piezoelectric element of the particular chips is, in fact, exposed after the encapsulation in the molding material but before the connection to the associated diaphragm. As a result, at least damage of the piezoelectric elements can be ruled out during the encapsulation in the molding material.

In an advantageous enhanced embodiment of the invention, it is advantageous when the at least one piezoelectric element of the particular chips is exposed only after the connection, in particular adhesion, to the associated diaphragm. Consequently, the at least one piezoelectric element is held, before and during the connecting, by the material of the chip and/or the molding material in such a way that it is not yet deflectable in the direction of the stroke axis but rather is immovable. As a result, damage of the at least one piezoelectric element can be prevented during the connection to the diaphragm. In this way, a force must be exerted, in the direction of the stroke axis, upon the piezoelectric element during the connection of the diaphragm, i.e., upon the two components to be connected to one another. If the piezoelectric element had already been exposed, it would be deflected by the connecting force, acting on one side, in such a strong manner that it would become damaged. In order to prevent this, it is advantageous when the at least one piezoelectric element is exposed not before, but rather only after it has been connected to the diaphragm.

It is advantageous when a portion of the reconstructed wafer is removed, portion by portion, up to a first side of the particular associated piezoelectric element from a first side of the reconstructed wafer, in particular using an etching method or a laser machining method. This is preferably a first exposure substep.

It is also advantageous when the reconstructed wafer is removed from its first side in such a way that a support frame and/or a coupling element arranged in the interior of the support frame are/is formed for each of the MEMS sound transducers.

It is advantageous when a portion of the reconstructed wafer is removed up to a first side of the particular associated piezoelectric element in a first exposure substep, in particular using an etching method or a laser machining method, so that the piezoelectric element is exposed on this side. It is advantageous when a portion of the reconstructed wafer is removed up to a second side of the particular associated piezoelectric element in a downstream second exposure substep, in particular using an etching method or a laser machining method, so that the piezoelectric element is also exposed on this side. It is advantageous when the outer contour, in particular the cantilever arm shape, of the at least one piezoelectric element is cut out of a piezoelectric layer forming the piezoelectric element, in particular using an etching method or a laser machining method, in particular in the first or the second exposure substep. Alternatively, this can also take place in a separate material-removal step downstream from the first or the second exposure substep.

The method can be designed to be very simple and fast when a first masking layer, which comprises multiple first openings associated with the chips, is arranged on the first side of the reconstructed wafer. After the first masking layer has been applied, at least a first opening is therefore associated with each chip of the reconstructed wafer. Thereafter, an etchant, in particular a fluid or a gas, is applied onto this first masking layer. The etching method is preferably a dry etching method or a wet etching method. The etchant can come into contact with the reconstructed wafer in the region of the first openings. As a result, in the region of the first openings, a portion of the reconstructed wafer is etched away up to the first side of the particular associated piezoelectric element. Depending on the design of the reconstructed wafer, an exposure of the particular piezoelectric elements can already take place as a result, namely when the wafer comprises no material on the second side of the piezoelectric element. In this case, preferably the first masking layer, including the etchant, is applied onto the reconstructed wafer only after the diaphragm units have been fastened to the reconstructed wafer. Alternatively, the reconstructed wafer can also be designed in such a way, however, that the particular piezoelectric element is not yet exposed in this method step, namely when material is still arranged on the second side of the piezoelectric element. In this case, it is advantageous when the first masking layer, including the etchant, is applied onto the reconstructed wafer already before the diaphragm units are connected to the particular chips. As a result, the first side of the piezoelectric element can be exposed with the aid of the etchant, whereas the piezoelectric element is still held fixedly in position on its opposite second side by a material of the reconstructed wafer.

It is advantageous when the first openings are each designed in such a way that the reconstructed wafer, in particular a substrate of the particular chip, is masked, i.e., covered, by the first masking layer in an outer region provided for the support frame of the particular MEMS sound transducer. As a result, a first hollow space can be advantageously formed, which is formed in the interior of the support frame of the particular MEMS sound transducer.

In this regard, it is additionally or alternatively advantageous when the first openings are each designed in such a way that the reconstructed wafer, in particular the substrate of the particular chip, is masked by the first masking layer in an inner region provided for the coupling element of the particular MEMS sound transducer. The inner region is preferably surrounded by the outer region and is spaced apart therefrom, in particular, completely, in this case. The inner region therefore forms an island in the interior of the outer region. As a result, the coupling element, which is freely movable in the direction of the stroke axis with respect to the support frame, can be formed in the interior of the support frame. The coupling element is therefore a component protruding from the piezoelectric element in the direction of the stroke axis, which is preferably formed from the substrate of the particular chip and/or can be connected, in the region of its free end, to the diaphragm provided therefor. The coupling element therefore indirectly connects the at least one piezoelectric element to the diaphragm in the completed MEMS sound transducer. As a result, the coupling element is formed in the interior of the first hollow space.

It is advantageous when the reconstructed wafer is removed, in particular etched away, in each case, in particular from its first side and/or in the region of the openings, in such a way that the at least one piezoelectric element is connected, at its first end, to the support frame and/or, at its second end, to the coupling element and/or is exposed on its two opposite longitudinal sides. Preferably, the at least one piezoelectric element has not yet been exposed at this point in time. On its second side opposite the coupling element, there is still material present, which holds the piezoelectric element in position.

In particular after the first side of the piezoelectric element has been exposed, in an advantageous enhanced embodiment of the invention, the at least one piezoelectric element of the particular chips is connected, in particular adhered, to the diaphragm, in particular in the region of its second end and/or indirectly via the coupling element. In this case, the diaphragm is pressed together with the at least one piezoelectric element in the direction of the stroke axis. Since the at least one piezoelectric element has not yet been exposed at this point in time, the force acting upon the piezoelectric element during pressing can be dissipated via the material still present on the other side of the piezoelectric element. As a result, damage of the piezoelectric element is prevented. Preferably, the piezoelectric element is indirectly connected to the diaphragm via the coupling element. In this case, the diaphragm is preferably pressed together with the coupling element on an end of the coupling element facing away from the piezoelectric element.

It is advantageous when the diaphragm is connected to the coupling element on an end of the coupling element facing away from the piezoelectric element in the direction of the stroke axis. Advantageously, a side of the recessed chip can therefore be provided with an adhesive, which then wets the free end of the coupling element and one side of the support frame.

It is advantageous when the diaphragm is directly connected to the support frame. Alternatively, it is advantageous when the diaphragm is indirectly connected to the support frame via a diaphragm frame holding the diaphragm in its edge region. Advantageously, a diaphragm frame, together with its diaphragm, forms a diaphragm unit. The connection of the diaphragm to the support frame preferably takes place simultaneously during the connection of the diaphragm to the coupling element. Preferably, the diaphragm frame is connected to the substrate of the chip and/or to the molding material associated with this chip.

It is advantageous when the diaphragm is mounted onto the reconstructed wafer individually, in particular as diaphragm units, or jointly as a contiguous diaphragm element.

It is also advantageous when a portion of the reconstructed wafer is removed, portion by portion, up to a second side of the particular associated piezoelectric element from a second side of the reconstructed wafer opposite the first side, in particular using an etching method or a laser machining method.

In an advantageous enhanced embodiment of the invention, a second masking layer is arranged on the second side of the reconstructed wafer opposite the first side in order to expose the at least one piezoelectric element. The second masking layer preferably comprises multiple second openings associated with the chips. Consequently, preferably at least one second opening is associated with each of the chips.

It is also advantageous when an etchant is applied on this second masking layer in order to expose the at least one piezoelectric element. As a result, in the region of the second openings, a portion of the reconstructed wafer is etched away up to the second side of the particular associated piezoelectric element. The at least one piezoelectric element of the chips therefore comprises no material—which rigidly connects the piezoelectric element to the support frame and holds it in position—on its first side or on its second side. Instead, the piezoelectric element is now exposed, so that it can be deflected along the stroke axis.

It is advantageous when the second openings are each designed in such a way that the reconstructed wafer, in particular the molding material associated with the particular chip, is masked, i.e., covered, by the second masking layer in an outer region provided for a cavity wall of the particular MEMS sound transducer. The outer region is therefore a frame-shaped, closed region, in the interior of which a second hollow space is formed. The first hollow space is therefore preferably formed on the first side of the piezoelectric element and/or the second hollow space is preferably formed on the second side of the piezoelectric element. The piezoelectric element, in the exposed state, can therefore swing into the first hollow space and into the second hollow space.

It is advantageous when the substrate of the particular chips is etched away from the first side of the reconstructed wafer and/or the molding material associated with the particular chips is etched away from the second side of the reconstructed wafer.

It is also advantageous when the first and/or the second masking layer are/is removed again after the etching process.

It is advantageous when the piezoelectric element itself is removed in an edge region, in particular with the aid of a laser, in order to form the contour of the piezoelectric element by sculpting same to generate a pre-defined shape of the edge region of the piezoelectric element. The chip preferably comprises a piezoelectric structure. This is at least one piezoelectric layer, which has been applied on the substrate. This layer is cut through along the contour during the formation of the contour of the piezoelectric element.

It is advantageous when the piezoelectric element itself is contoured and/or cut in its edge region either after the exposure of its first side or after the exposure of its second side.

In order to manufacture the reconstructed wafer, it is advantageous when the chips, separated from one another, are arranged, in particular adhesively bonded, on a carrier before the encapsulation in the molding material. The carrier is therefore utilized as an interim fixation of the chips in order to be able to encapsulate these in the molding material.

Furthermore, it is advantageous in this regard when the carrier is removed again after the molding material has cured. Preferably, the carrier is arranged in such a way and/or is removed in such a way that the chips are encapuslated after the molding material has been cast around them and, after the carrier has been removed, are exposed on the first side of the reconstructed wafer.

In order to design the MEMS sound transducers to be as thin as possible, it is advantageous when the reconstructed wafer is partially removed, in particular ground off, on its first side in order to reduce its thickness. In this case, it is advantageous when an auxiliary carrier is arranged, in advance, on the second side of the reconstructed wafer, which is preferably removed again after the grinding.

It is also advantageous when an electrical insulation layer and/or a metallic redistribution layer for redistributing contact points of the particular chip are applied on the first and/or the second side of the reconstructed wafer. The redistribution layer is preferably arranged before the masking layer is applied, so that the redistribution layer is protected by the masking layer during the etching process.

It is advantageous when the insulation layer is formed by the molding material during the encapsulation of the chips.

It is advantageous when the reconstructed wafer is manufactured using a chip-first method. In this case, the molding material is initially cast around the chips and only thereafter is the redistribution layer formed.

Alternatively, it is advantageous when the reconstructed wafer is manufactured using a chip-last method. In this case, the redistribution layer is initially formed and only thereafter are the chips arranged on this redistribution layer and encapsulated in the molding material.

It is advantageous when the reconstructed wafer is manufactured using a face-down method in which the isolated chips are arranged, before the encapsulation and/or in order to be encapsulated in the molding material, in such a way that their contact points face downward.

It is advantageous when the reconstructed wafer is manufactured using a face-up method in which the isolated chips are arranged, before the encapsulation and/or in order to be encapsulated in the molding material, in such a way that their contact points face upward.

The invention further relates to a MEMS sound transducer, in particular for generating and/or detecting sound waves in the audible wavelength spectrum and/or ultrasonic range, comprising a chip, which includes a support frame and at least one piezoelectric element held by the support frame. The at least one piezoelectric element is exposed in such a way that it is deflectable with respect to the support frame along a stroke axis. The MEMS sound transducer also comprises a molding material, in which the chip is at least partially encapsulated. The molding material is preferably an, in particular sprayable, plastic, with which the chips are coated. Moreover, the MEMS sound transducer comprises a diaphragm, which is connected to the chip and/or the molding material directly in its edge region or indirectly via a diaphragm unit. The diaphragm unit preferably comprises a diaphragm frame and a diaphragm held by the diaphragm frame. The diaphragm is connected to the at least one piezoelectric element in the region of the stroke axis. The diaphragm and the piezoelectric element are therefore connected to each other and are deflectable along the stroke axis. The MEMS sound transducer unit is manufactured using a method according to the preceding description, wherein the mentioned features can be present individually or in any combination. Advantageously, the manufacture of the MEMS sound transducer is highly cost-effective as a result.

BRIEF DESCRIPTION OF THE DRAWINGS

Further advantages of the invention are described in the following exemplary embodiments. Wherein:

FIG. 3 shows a step following the step shown in FIG. 2 in the method steps for manufacturing multiple MEMS sound transducers according to FIG. 1.

FIG. 4 shows a step following the step shown in FIG. 3 in the method steps for manufacturing multiple MEMS sound transducers according to FIG. 1.

FIG. 5 shows a step following the step shown in FIG. 4 in the method steps for manufacturing multiple MEMS sound transducers according to FIG. 1.

FIG. 6 shows a step following the step shown in FIG. 5 in the method steps for manufacturing multiple MEMS sound transducers according to FIG. 1.

FIG. 7 shows a step following the step shown in FIG. 6 in the method steps for manufacturing multiple MEMS sound transducers according to FIG. 1.

FIG. 8 shows a step following the step shown in FIG. 7 in the method steps for manufacturing multiple MEMS sound transducers according to FIG. 1.

FIG. 9 shows a step following the step shown in FIG. 8 in the method steps for manufacturing multiple MEMS sound transducers according to FIG. 1.

FIG. 10 shows a step following the step shown in FIG. 9 in the method steps for manufacturing multiple MEMS sound transducers according to FIG. 1.

FIG. 11 shows a step following the step shown in FIG. 10 in the method steps for manufacturing multiple MEMS sound transducers according to FIG. 1.

FIG. 12 shows a step following the step shown in FIG. 11 in the method steps for manufacturing multiple MEMS sound transducers according to FIG. 1.

DETAILED DESCRIPTION OF EXEMPLARY EMBODIMENTS

Figure 1:
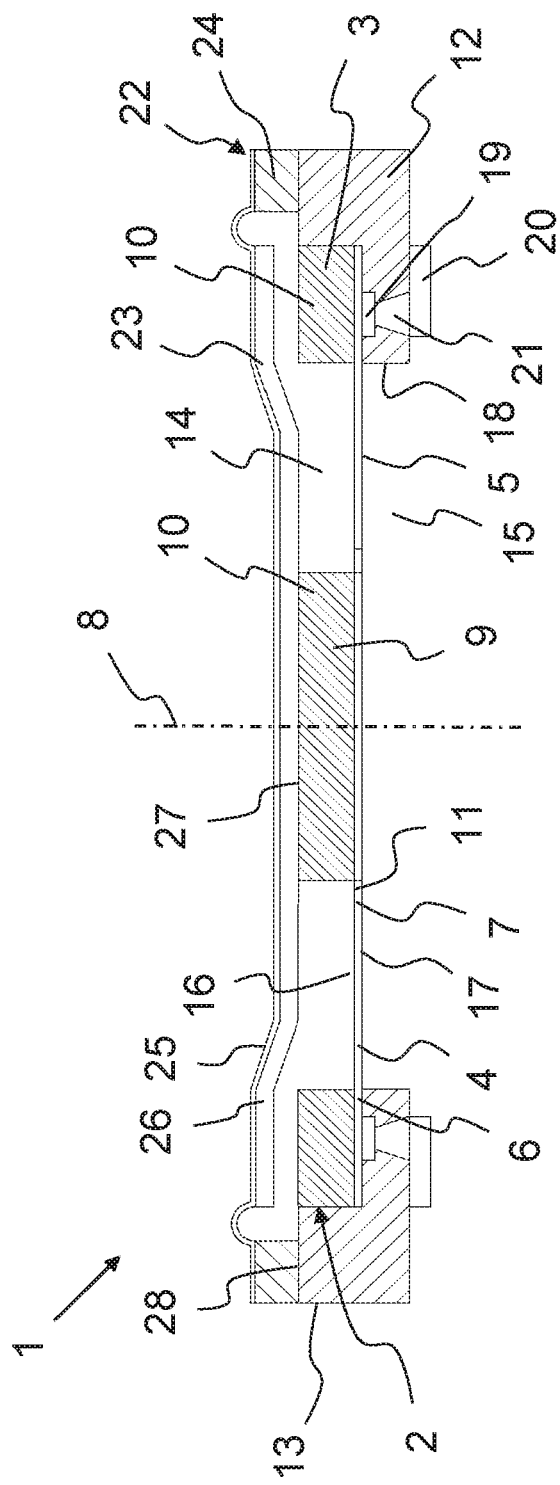
FIG. 1 shows a schematic sectional view of a MEMS sound transducer.

FIG. 1 shows a MEMS sound transducer 1, in particular for generating and/or detecting sound waves in the audible wavelength spectrum and/or ultrasonic range. This MEMS sound transducer 1 is manufactured, for example, using a manufacturing method according to the method steps represented schematically in FIGS. 2 through 12.

According to FIG. 1, the MEMS sound transducer 1 comprises a chip 2, which forms at least one support frame 3 and at least one piezoelectric element 4, 5. According to the present exemplary embodiment, the MEMS sound transducer 1 comprises a first piezoelectric element 4 and a second piezoelectric element 5. Alternatively, the MEMS sound transducer 1 can also comprise, however, only a single piezoelectric element 4, 5, or also more than two piezoelectric elements 4, 5. The first piezoelectric element 4 is connected at its first end 6 to the support frame 3. A second end 7 of the first piezoelectric element 4 is configured so that it can be deflected along a stroke axis 8, which extends in a direction that is generally normal to the surface of the piezoelectric element 4 in its non-deflected state. For this purpose, the piezoelectric element 4 is cut free at its sides, which extend in the direction of elongation away from the first end 6 and toward the second end 7. Moreover, the MEMS sound transducer 1 comprises a coupling element 9. The coupling element 9 is arranged in the interior of the support frame 3. The coupling element 9 and the support frame 3 are made of a substrate 10 of the chip 2. The first piezoelectric element 4 is connected at its second end 7 to the coupling element 9. This is implemented, in the present case, via flexible and/or articulated connecting elements 11. The second piezoelectric element 5 is connected to the support frame 3 and to the coupling element 9 in a similar way. The coupling element 9 can be deflected along the direction of the stroke axis 8 via the first piezoelectric element 4 and the second piezoelectric element 5. A movement of the coupling element 9 along the stroke axis 8 can also be detected by the first piezoelectric element 4 and the second piezoelectric element 5.

According to FIG. 1, the chip 2 is partially encapsulated in a molding material 12. The molding material 12 is preferably a sprayable plastic, with which the chip 2 is coated during the manufacturing process. The molding material 12 forms a portion of the support frame 3 and/or a housing 13 of the MEMS sound transducer 1.

The support frame 3, the first piezoelectric element 4 and the second piezoelectric element 5 of the chip 2 combine to define a first hollow space 14 that is disposed in the interior of the support frame 3 to a first side of the piezoelectric elements 4, 5. The coupling element 9 is arranged in this first hollow space 14. Moreover, as shown in FIG. 1, the molding material 12 is configured to combine with a second side, opposite the first side, of the piezoelectric elements 4, 5 to define a second hollow space 15 of the MEMS sound transducer 1. The first hollow space 14 is therefore located on a first side 16 of the particular piezoelectric element 4, 5 and the second hollow space 15 is located on a second side 17 of the particular piezoelectric element 4, 5. The piezoelectric elements 4, 5 can therefore swing into the first hollow space 14 and into the second hollow space 15 along the stroke axis 8. The second hollow space 15 forms a cavity or a back volume of the MEMS sound transducer 1 in this case. A cavity wall 18 of the MEMS sound transducer 1 is therefore formed by the molding material 12. The second hollow space 15 is open on its side facing away from the piezoelectric elements 4, 5.

As is apparent from FIG. 1, the chip 2 also comprises contact points 19 for making electrically conducting connections to the piezoelectric elements 4, 5. The MEMS sound transducer 1 also comprises a redistribution layer 20. The redistribution layer 20 is connected to at least one of the contact points 19 via a feedthrough 21 that desirably is defined through the molding material. The redistribution layer 20 is separated from the chip 2 by an electrically insulating insulation layer. In the exemplary embodiment represented in FIG. 1, the insulation layer is formed by the molding material 12. Alternatively, an additional insulation layer could also be formed.

The chip 2 and the molding material 12 form a first unit, which is connected to a diaphragm 23 during the manufacturing process, which is explained in greater detail in the following text with reference to FIGS. 2 through 12. According to the present exemplary embodiment, the diaphragm 23 is part of a diaphragm unit 22, which includes the diaphragm 23 and a diaphragm frame 24 holding the diaphragm 23 in its edge region. Furthermore, the diaphragm 23 according to the present exemplary embodiment comprises a flexible diaphragm layer 25 and a reinforcing plate 26 that is attached to the underside of the flexible diaphragm layer 25. In an exemplary embodiment not represented in the present case, the diaphragm 23 could also be directly fastened to the substrate 10 that forms the coupling element 9 and/or to the molding material 12. In this case, for example, the diaphragm frame 24 would be formed by the molding material 12 and/or the substrate 10.

The diaphragm 23 is connected, in particular adhered, to the at least one piezoelectric element 4, 5 in a first connection region 27. According to the present exemplary embodiment, the first connection region 27 is formed between the coupling element 9 and the diaphragm 23. Consequently, the piezoelectric elements 4, 5 are indirectly connected to the diaphragm 23 via the coupling element 9. Moreover, the diaphragm unit 22 is connected in a second connection region 28 to the first unit that is the chip 2 and the molding material 12. The second connection region 28 is formed, in the present case, between the diaphragm frame 24 and the molding material 12.

The above-described MEMS sound transducer 1 can be manufactured using the manufacturing method described in detail in the following description, wherein the particular method steps are represented schematically in FIGS. 2 through 12.

Figure 2:
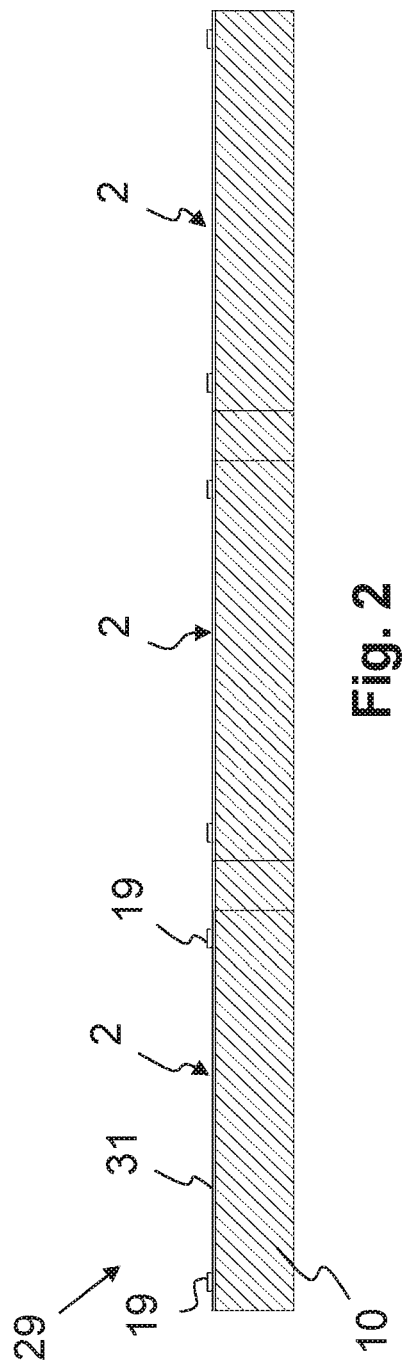
FIG. 2 shows an initial step in the individual method steps for manufacturing multiple MEMS sound transducers according to FIG. 1.

At the beginning of the manufacturing method in accordance with an embodiment of the present invention, initially, a wafer 29 represented in FIG. 2 is utilized to manufacture a reconstructed wafer 30 represented in FIG. 7. The term "wafer" refers to a plate-like element, which is preferably made of a monocrystalline or polycrystalline blank. Wafers are utilized as a substrate for the chips 2. The wafer 29 can have a circular or square shape. In the case of a square shape, the wafer 29 is also referred to as a panel.

As is clear from FIG. 2, the wafer 29 comprises multiple chips 2, of which only one is provided with a reference number, for the sake of clarity. The chips 2 essentially comprise the substrate 10, on which at least one piezoelectric layer 31 is arranged, from which the at least one piezoelectric element 4, 5 is formed in the course of the manufacturing method. The piezoelectric layer 31 can be a sandwich composite comprising multiple layers, in particular piezoelectric layers and/or electrode layers.

According to FIG. 3, the plurality of chips 2 are separated from one another to form isolated chips 2. The wafer 29 is diced for this purpose. The isolated chips 2, which are provided with respective contact points 19 on their upper surfaces of the piezoelectric layer 31 as schematically shown in FIG. 2, are subsequently arranged spaced apart from one another. This can take place on a carrier 32, as represented in FIG. 3. The isolated chips 2 are preferably adhesively bonded onto the carrier 32.

As is apparent from FIG. 3, the isolated chips 2 are arranged in such a way that their contact points 19 face upward, as represented in the figure. The manufacture therefore takes place using a so-called face-up method. Alternatively, the isolated chips 2 could also be arranged, in an exemplary embodiment not represented in the present case, in such a way that their contact points 19, as represented in the figure, face downward. The manufacture would therefore take place using a so-called face-down method.

Thereafter, as schematically shown in FIG. 4, the molding material 12 is cast, in particular sprayed, around the chips 2, which are spaced apart from one another. The chips 2 therefore each rest, via a first side, against the carrier 32 and are otherwise completely encapsulated in the molding material 12.

According to FIG. 5, after the molding material 12 has cured, a redistribution layer 20 is applied onto the molding material. Furthermore, the redistribution layer 20 is connected to the contact points 19 of the particular chip 2 via feedthroughs 21. In the present case, the feedthroughs 21 extend through the molding material 12. Additionally or alternatively, in an exemplary embodiment not represented in the present case, the feedthroughs 21 could also extend through the carrier substrate 32.

Thereafter, the carrier substrate 32 is removed, as represented schematically in FIG. 6. After the carrier 32 has been removed, the reconstructed wafer 30 is essentially completed. The chips 2 are therefore have been encapsulated in the molding material 12 and are exposed only on a first side 33 of the reconstructed wafer 30. The redistribution layer 20 is located on the second side 34 of the reconstructed wafer 30.

The above-described method for manufacturing the reconstructed wafer 30 is referred to as a chip-first method, since the isolated chips 2 are initially encapsulated in the molding material 12 and, only thereafter, provided with the redistribution layer 20.

In an alternative exemplary embodiment not represented in the present case, the reconstructed wafer 30 could also be manufactured using a chip-last method. In this case, the redistribution layer 20 would be formed first. Only thereafter would the chips 2 be mounted on this redistribution layer 20 and subsequently encapsulated in the molding material 12.

In order to reduce the thickness of the reconstructed wafer 30, a portion of the reconstructed wafer 30 can be removed from the first side 33, as represented schematically in FIG. 7. This can take place, for example, via grinding. In order to avoid damage of the reconstructed wafer 30 in this processing step, it is advantageous when the reconstructed wafer 30 is arranged for the interim on an auxiliary carrier, which is not represented in the present case. Thereafter, the auxiliary carrier is removed again.

In an exemplary embodiment that is not represented in the present figures, additionally or alternatively to the redistribution layer 20 formed on the second side 34 of the reconstructed wafer 30, a redistribution layer 20 could also be formed on the first side 33 of the reconstructed wafer 30.

In the subsequent method steps explained below in relation to FIGS. 8 and 9, a portion of the reconstructed wafer 30 is now removed, portion by portion, from the first side 33 of the reconstructed wafer 30 up to the first side 16 of the particular associated piezoelectric element 4, 5, in particular using an etching method or a laser machining method. This takes place in such a way that the support frame 3 and the coupling element 9 arranged in the interior of the support frame 3 are formed as schematically depicted in FIG. 1.

An etching method is described, by way of example, in the following description. The reconstructed wafer 30 has been turned in FIG. 8 from what is shown in FIG. 7. In FIG. 8, the first side 33 therefore faces upward, and its second side 34 faces downward. In the method step represented schematically in FIG. 8, a first masking layer 35 is applied onto the reconstructed wafer 30. In the present embodiment schematically shown in FIG. 8, this application of the first masking layer 35 takes place on the first side 33 of the reconstructed wafer 30. The first masking layer 35 is then configured by removing portions of the first masking layer in order to define a plurality of first openings 36 associated with the chips 2. Consequently, at least one first opening 36 is associated with each of the chips 2. In the present exemplary embodiment schematically shown in FIG. 8, each of the first openings 36 is designed in such a way that the reconstructed wafer 30 is covered by portions of the first masking layer 35 in an outer region 37, which is provided for forming the support frame 3 of the particular MEMS sound transducer 1 represented in FIG. 1. Moreover, the first openings 36 in the present exemplary embodiment are each designed in such a way that the reconstructed wafer 30 is covered by portions of the first masking layer 35 in an inner region 38, which is provided for forming the coupling element 9 of the particular MEMS sound transducer 1 represented in FIG. 1. The outer region 37 therefore forms a support frame 3 (FIG. 1), and in the interior of the support frame 3 a portion of the first masking layer 35 defines the inner region 38 that is arranged in the form of an island. Accordingly, the inner region 38 has no connection to the outer region 37.

After the first masking layer 35 has been configured as schematically shown in FIG. 8, then an etchant is applied onto the reconstructed wafer 30. The etchant comes into contact with the reconstructed wafer 30 in the region of the first openings 36, whereby the reconstructed wafer 30 is partially etched away, as represented schematically in FIG. 9. Due to the configuration of the first openings 36, the etchant comes into contact, in these regions, exclusively with the substrate 10 of the particular chip 2. As a result, the reconstructed wafer 30, in particular the substrate 10 of the particular chip 2, is etched away in the region of the first openings 36 up to the first side 16 of the piezoelectric layer 31 or of the piezoelectric elements 4, 5 made thereof. The piezoelectric elements 4, 5 have not yet been exposed at this point in time, since they are still held on their second side 17 by the material of the molding material 12. The first hollow space 14 is now formed only on the first side 16 of the particular piezoelectric element 4, 5. Moreover, the coupling element 9 was formed in the interior of this first hollow space 14 with the aid of this method step. The piezoelectric elements 4, 5 are connected, in each case, at their one end 6 to the support frame 3 and, at their other end 7, to the coupling element 9. A deflection along the stroke axis 8 is not yet possible at this point in time, since the piezoelectric elements 4, 5 have not yet been exposed. After the etching process, the first masking layer 35 is removed again.

Preferably, during or immediately after this method step, the piezoelectric element 4, 5 itself is removed or cut out in an edge region, in particular with the aid of a laser, in order to form the contour or peripheral outline of the edge region of the particular piezoelectric element 4, 5.

Thereafter, i.e., after the contouring of the piezoelectric element 4, 5 to define the shape of the outer edge of the piezoelectric element 4, 5, the particular diaphragms 23 are mounted onto the reconstructed wafer 30. The diaphragms 23 can be mounted individually, in particular as diaphragm units 22, or jointly as a contiguous diaphragm element.

Thereafter, i.e., after the mounting of the diaphragms 23 onto the reconstructed wafer 30, sections of the molding material 12 are removed so that the piezoelectric elements 4, 5 are exposed. For this purpose, a portion of the reconstructed wafer 30 is removed, portion by portion, up to the second side 17 of the particular associated piezoelectric element 4, 5 from the second side 34 of the reconstructed wafer 30 opposite the first side 16, in particular using an etching method or a laser machining method.

Preferably, after this etching process that exposes sections of the piezoelectric element 4, 5, then the piezoelectric element 4, 5 itself is cut free in an edge region, in particular with the aid of a laser, in order to form the shape of the outer perimeter of the particular piezoelectric element 4, 5.

The connection of the particular associated diaphragm 23 to the particular associated and not-yet exposed piezoelectric element 4, 5 takes place for each of the chips 2 in the method step represented schematically in FIG. 10.

In an alternative exemplary embodiment that is not represented schematically in the present figures, the diaphragms 23 could be applied jointly as a contiguous diaphragm element. In this alternative case, a continuous diaphragm layer or the contiguous diaphragm element would be applied on the first side 33 of the reconstructed wafer 30 and fastened, in the contact regions, to the reconstructed wafer 30.

However, the diaphragms 23 can be applied onto the reconstructed wafer 30 according to the present exemplary embodiment individually, in particular as diaphragm units 22. For this purpose, the diaphragm units 22 are each connected to the corresponding coupling element 9 in the first connection region 27. Moreover, the diaphragm frames 24 are each connected to the corresponding support frame 3 in the second connection region 28, in particular indirectly via the molding material 12. Since the piezoelectric elements 4, 5 have not been exposed at this stage of the manufacturing method, but rather are still held on their second side 17 by the molding material 12, the diaphragm 23 can be pressed together with the piezoelectric elements 4, 5 in the first connection region 27, in particular indirectly via the coupling element 9, without the piezoelectric elements 4, 5 being deflected and damaged by the application of a strong force. A fixed connection, in particular an adhesive bond, can be formed in the first connection region 27, however.

Each discrete section of the particular second side 17 of the piezoelectric elements 4, 5 is exposed only after the diaphragm 23 of the particular diaphragm unit 22 has been connected to the corresponding piezoelectric elements 4, 5. This also takes place using a masking and subsequent etching method. For this purpose, according to FIG. 11, a second masking layer 39 is applied onto the second side 34 of the reconstructed wafer 30. The second masking layer 39 is configured by etching to define second openings 40, at least one of which is associated with the particular chip 2 in each case. The second openings 40 are designed in such a way that the reconstructed wafer 30 is masked by the second masking layer 39 in a second outer region 41 provided for the cavity wall 18 (cf. FIG. 1) of the particular MEMS sound transducer 1. The second openings 40 are surrounded by defined by the second masking layer 39 in a frame-shaped manner. After the second masking layer 39 has been configured as shown schematically in FIG. 11, then an etchant is applied onto the second side 34 of the reconstructed wafer 30. As a result, the substrate 10 of the chips 2 is etched away up to the second side 17 of the particular piezoelectric elements 4, 5 as shown schematically in FIG. 12. After the etching away of the substrate 10, then the second masking layer 39 is removed again as shown schematically in FIG. 12.

As represented schematically in FIG. 12, the piezoelectric elements 4, 5 are exposed, after this method step, not only on their first side 16, but rather now also on their second side 17. The piezoelectric elements 4, 5 have therefore been exposed on both opposite sides 16, 17. Consequently, the piezoelectric elements 4, 5 can now be deflected together with the coupling element 9 and/or the particular diaphragm 23 along the stroke axis 8 (cf. FIG. 1).

According to FIG. 11, portions of the second masking layer 39 according to the present exemplary embodiment define third openings 42, which are arranged between two MEMS sound transducers 1. The third openings 42 are utilized for separating the MEMS sound transducers 1 from one another during the etching process.

The present invention is not limited to the represented and described exemplary embodiments. Modifications within the scope of the claims are also possible, as is any combination of the features, even if they are represented and described in different exemplary embodiments.

LIST OF REFERENCE NUMBERS

1 MEMS sound transducer
2 chips
3 support frame
4 first piezoelectric element
5 second piezoelectric element
6 first end of the piezoelectric element
7 second end of the piezoelectric element
8 stroke axis
9 coupling element
10 substrate
11 connecting element
12 molding material
13 housing
14 first hollow space
15 second hollow space
16 first side of the piezoelectric element
17 second side of the piezoelectric element
18 cavity wall
19 contact points
20 redistribution layer
21 feedthrough
22 diaphragm units
23 diaphragm
24 diaphragm frame
25 diaphragm layer
26 reinforcing plate
27 first connection region
28 second connection region
29 wafer
30 reconstructed wafer
31 piezoelectric layer
32 carrier
33 first side of the reconstructed wafer
34 second side of the reconstructed wafer
35 first masking layer
36 first opening
37 first outer region
38 inner region
39 second masking layer
40 second opening
41 second outer region
42 third opening

What is claimed is:

1. A method for manufacturing a plurality of MEMS sound transducers, the method including the following steps:
manufacturing a reconstructed wafer that includes a plurality of individual chips, wherein each of the plurality of individual chips includes a piezoelectric element;
processing the reconstructed wafer so as to separate each of the plurality of individual chips from one another;
disposing the plurality of separated individual chips spaced apart from one another on a carrier and adhesively bonding a first side of each of the plurality of separated individual chips to the carrier;
encapsulating the plurality of separated individual chips in a molding material to the carrier;
exposing the piezoelectric element of each the plurality of individual chips, so that the exposed piezoelectric element is deflectable along a stroke axis;
connecting a separate diaphragm to each of the exposed piezoelectric elements so that each of the separate diaphragms is deflectable along the stroke axis together with the exposed piezoelectric element that is connected to the separate diaphragm;

and isolating the plurality of MEMS sound transducers, wherein each of the isolated MEMS sound transducers includes at least one of the plurality of separated individual chips and one of the separate diaphragms.

2. The manufacturing method as claimed in claim 1, wherein the piezoelectric element of each of the plurality of individual chips is exposed before the connection of the piezoelectric element of each of the plurality of individual chips to the associated separate diaphragm or wherein the piezoelectric element of each of the plurality of individual chips is exposed only after the connection of the piezoelectric element of each of the plurality of individual chips to the associated separate diaphragm.

3. The manufacturing method as claimed in claim 1, wherein an etching method or a laser machining method is used to remove a portion of the reconstructed wafer in a region from a first side of the reconstructed wafer to define a first side of the particular associated piezoelectric element.

4. The manufacturing method as claimed in claim 3, wherein the etching method or the laser machining method is used to remove a portion of the reconstructed wafer in a region from a second side of the reconstructed wafer to define a second side of the particular associated piezoelectric element.

5. The manufacturing method as claimed in claim 1, further comprising the step of removing a region of the reconstructed wafer from a first side of the reconstructed wafer in such a way as to define a support frame for each of the plurality of isolated MEMS sound transducers.

6. The manufacturing method as claimed in claim 5, further comprising the steps of arranging on the first side of the reconstructed wafer a first masking layer, which includes a plurality of first openings associated with the plurality of individual chips, and thereafter applying an etchant onto this first masking layer, so that, in a region of the plurality of first openings, a portion of the reconstructed wafer is etched away up to a first side of the particular associated piezoelectric element.

7. The manufacturing method as claimed in claim 6, wherein each of the first openings is configured in such a way that the reconstructed wafer is masked by the first masking layer in a first outer region provided for the support frame of the particular MEMS sound transducer and in an inner region provided for a coupling element of the particular MEMS sound transducer.

8. The manufacturing method as claimed in claim 6, wherein the reconstructed wafer is etched away from a first side and/or in the region of the first openings, in such a way in each case that a first end of the piezoelectric element of each of the plurality of individual chips is connected to the support frame and a second end of the piezoelectric element of each of the plurality of individual chips is connected to a coupling element and is exposed on each of two opposite longitudinal sides of the piezoelectric element of each of the plurality of individual chips.

9. The manufacturing method as claimed in claim 8, wherein after the exposure of the first side of the piezoelectric element of each of the plurality of individual chips, the piezoelectric element of each of the plurality of individual chips is connected to the separate diaphragm in a region of the second end of the piezoelectric element of each of the plurality of individual chips or indirectly via the coupling element.

10. The manufacturing method as claimed in claim 8, wherein the separate diaphragm is connected to the coupling element at an end of the coupling element facing away from the piezoelectric element in the direction of the stroke axis, and wherein the separate diaphragm is connected to the support frame directly or the separate diaphragm is connected to the support frame indirectly via a diaphragm frame holding an edge region of the separate diaphragm.

11. The manufacturing method as claimed in claim 5, further comprising the step of removing the region of the reconstructed wafer from the first side of the reconstructed wafer in such a way as to define a coupling element arranged in an interior of the support frame for each of the plurality of isolated MEMS sound transducers.

12. The manufacturing method as claimed in claim 1, wherein each separate diaphragm is mounted onto the reconstructed wafer as a contiguous diaphragm element and thereafter divided into a separate section for each of the exposed piezoelectric elements.

13. The manufacturing method as claimed in claim 1, further comprising the steps of arranging on a second side of the reconstructed wafer a second masking layer, which includes a plurality of second openings associated with the plurality of individual chips, and thereafter applying an etchant onto this second masking layer, so that, in a region of the plurality of second openings, a portion of the reconstructed wafer is etched away up to the second side of the particular associated piezoelectric element.

14. The manufacturing method as claimed in claim 13, wherein each of the second openings is each configured in such a way that the reconstructed wafer is masked by the second masking layer in a second outer region provided for a cavity wall of the particular MEMS sound transducer.

15. The manufacturing method as claimed in claim 1, further comprising the step of using a laser to remove an edge region of each of the piezoelectric elements to form a contour of the piezoelectric element.

16. The manufacturing method as claimed in claim 15, wherein the edge region of each of the piezoelectric elements is etched to be given a pre-defined shape after the exposure of each of the piezoelectric elements.

17. The manufacturing method as claimed in claim 1, wherein a substrate is the carrier.

18. The manufacturing method as claimed in claim 17, further comprising the steps of curing the molding material and thereafter removing the carrier after the molding material has been cured, so that the plurality of individual chips are encapsulated in the molding material and are exposed on a first side of the reconstructed wafer.

19. The manufacturing method as claimed in claim 1, further comprising the step of partially grinding off a portion of the reconstructed wafer in order to reduce the thickness of the reconstructed wafer.

20. The manufacturing method as claimed in claim 1, wherein an electrical insulation layer and/or a redistribution layer for redistributing contact points of the particular individual chip is/are applied on a first side of the reconstructed wafer.

* * * * *